United States Patent
Araki

(10) Patent No.: US 7,464,851 B2
(45) Date of Patent: Dec. 16, 2008

(54) WIRE BONDING METHOD AND APPARATUS THEREFOR

(75) Inventor: Chihiro Araki, Shuuchi-gun (JP)

(73) Assignee: Yamaha Motor Electronics Co. Ltd, Mori-machi (JP)

( * ) Notice: Subject to any disclaimer, the term of this patent is extended or adjusted under 35 U.S.C. 154(b) by 1839 days.

(21) Appl. No.: 10/063,870

(22) Filed: May 21, 2002

(65) Prior Publication Data

US 2002/0179678 A1    Dec. 5, 2002

(30) Foreign Application Priority Data

May 30, 2001 (JP) .............................. 2001-161742

(51) Int. Cl.
*B23K 1/06* (2006.01)
*B23K 31/02* (2006.01)

(52) U.S. Cl. .................. 228/102; 228/110.1; 228/180.5

(58) Field of Classification Search .............. 228/110.1, 228/102, 180.5, 1.1, 4.5, 8
See application file for complete search history.

(56) References Cited

U.S. PATENT DOCUMENTS

| 5,002,217 | A | * | 3/1991 | Tani et al. | ................. 228/110.1 |
| 5,148,964 | A | * | 9/1992 | Shimizu | ..................... 228/102 |
| 5,323,952 | A | * | 6/1994 | Kato et al. | ................... 228/102 |
| 5,431,324 | A | * | 7/1995 | Kajiwara et al. | ............. 228/102 |
| 5,433,369 | A | * | 7/1995 | Okumura | ................. 228/110.1 |

FOREIGN PATENT DOCUMENTS

| JP | 7-29944 | * | 1/1995 |
| JP | 8-288327 | * | 11/1996 |

* cited by examiner

*Primary Examiner*—Kiley Stoner
(74) *Attorney, Agent, or Firm*—Ernest A. Beutler

(57) ABSTRACT

Methods and apparatus for detecting the welding state in each bonding section and the application of ultrasonic vibration and pressing force is stopped promptly when completion of welding is determined. This permits bonding to be finished, corresponding to each wire bonding section at all times, in a shortest time without need of application of unnecessary ultrasonic vibration and pressing force after completion of welding in spite of dispersion of the welding characteristic of the individual bonding pads.

7 Claims, 6 Drawing Sheets

WIRE BONDING METHOD AND APPARATUS THEREFOR

BACKGROUND OF INVENTION

This invention relates to a wire bonding method and apparatus and more particularly to a method and apparatus for bonding wire leads to a semiconductor device.

Many forms of circuits employ semiconductors mounted on circuit boards. Semiconductor device production processes include a wire bonding process by which a semiconductor chip is mounted on a lead frame or a substrate. The circuit includes a lead formed on the outside the chip or an electrode pad formed on the substrate are connected by a metallic wire such as aluminum or a gold.

Typically in this wire bonding process, the metallic wire is drawn out to a bonding tool section of a wire bonder (wire bonding apparatus) and welded with pressure to a bonding pad of the semiconductor chip. In an ultrasonic type wire bonder, an ultrasonic vibration is applied to the bonding tool. The wire is bonded by pressing both it and the tool against the chip bonding pad.

When a metallic wire is bonded to a semiconductor chip in a conventional wire bonder, a duration of bonding time is preset. Then an ultrasonic wave and a pressing force are applied to the tool and wire for the preset bonding time. The preset time is determined by taking account of the bonding characteristic of the bonding section to assure maximum dispersion of the wire and adding a certain time margin for safety.

However, when a metallic wire is actually welded in this the length of time required for completion of bonding can vary from the preset time depending on dispersion of the welding characteristic of the individual pad. Thus even though a good bond is established the bonding operation continues until the preset time has elapsed. Therefore, unnecessary vibration and pressing force is exerted on the semiconductor chip, causing cracking or breakage, and deterioration of the internal function.

As an example of this problem is present in a power control unit or the like, in particular, in rotating equipment such as a motor for a motor-driven vehicle or other motors or a generator. In order to shorten the length of the wiring to decrease resistance to improve the performance of semiconductor devices and to achieve higher efficiency of production processes as well as higher installation density, semiconductor devices are mounted as bare chips on an electrode pattern or a circuit pattern of a substrate. When bonding is performed for such bare chips by the aforenoted conventional manner, the problem of unnecessary vibration and pressing force is amplified. Thus increasing the problem of the cracking and deterioration.

Therefore it is an object of this invention to provide a wire bonding method and apparatus capable of bonding a metallic wire to a semiconductor chip in an optimum and a minimum time regardless of the welding characteristic of the bonding section.

SUMMARY OF INVENTION

A first feature of the invention is embodied in a wire bonding method for pressurewelding a metallic wire to device while applying ultrasonic vibration. The method comprise the steps of applying pressure between the metallic wire and the device and simultaneously applying a vibratory force thereto. The degree of bonding between the metallic wire and the device is detected. When completion of the state of bonding is detected, the application of ultrasonic vibration and pressure is stopped.

Another feature of the invention is embodied in a wire bonding apparatus having a tool for holding a metallic wire to press it against a device. A vibrator applies ultrasonic vibration to the tool. An oscillator powers the vibrator. A control section for controls the output of the oscillator. A pressing device applies a pressing force to the tool. A bonding detector detects the degree of bonding of the metallic wire to the device to advise the control section to terminate bonding.

DETAILED DESCRIPTION

Figure 1:
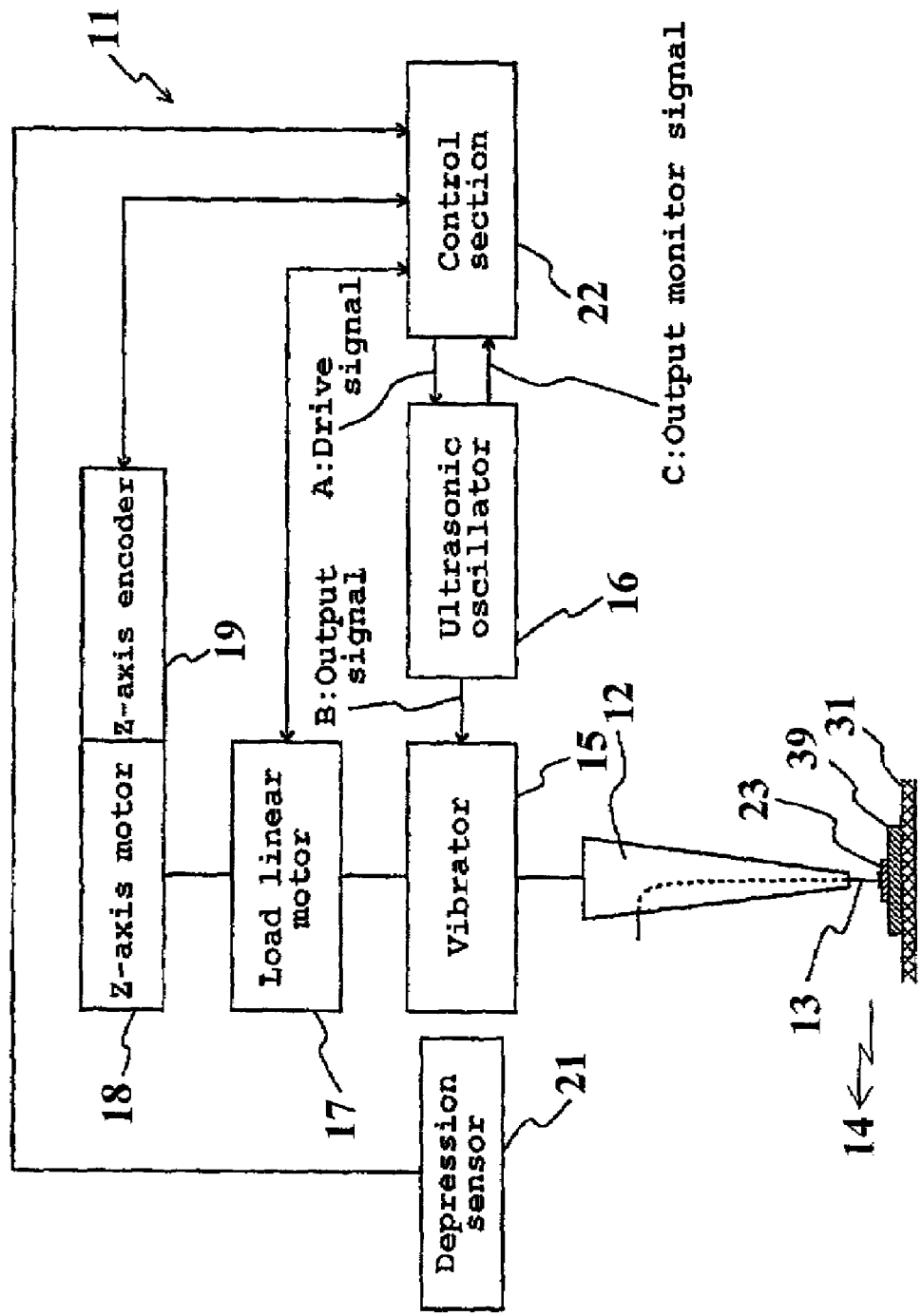
FIG. 1 is a partially schematic side elevational view of a welding apparatus constructed and operated according to the invention with portions of the welded components being shown in cross section.

Referring now in detail to the drawings, a wire welding apparatus constructed and operated in accordance with the invention is indicated generally by the reference numeral 11. The apparatus comprises a tool 12 that feeds a wire 13 towards a workpiece, indicated generally at 14, and having a specific construction that will be described later by reference to FIGS. 3-11. The tool 12 is of any type as is normally used in this art and as such a detailed description of it is not necessary for those skilled in the art to practice the invention.

The tool 12 is associated with a vibrator 15 which also may be of a type as normally used in this art. The vibrator 15 is driven by an ultrasonic oscillator 16 for ultrasonically vibrating the vibrator 15, the tool 12 and the wire 13. Again the construction of the oscillator 16 may be of any type used in the art.

A load applying linear motor 17 applying a pressing force to the tool 12 fixed integrally to the vibrator 15. Again this motor 17 may be of an type normally used for this purpose. The tool 12, wire 13 vibrator 15 and linear load motor 17 are all positioned vertically by a Z-axis motor 18 for driving the tool 12 in the Z-direction (vertically). A Z-axis encoder 19 detects the position to which the tool 12 is driven by the Z-axis motor 18. Again these components may be of the type normally used in the art.

A depression sensor 21 detects the amount of depression of the tool 12 and wire 13 caused by the pressing force during bonding. Finally the apparatus includes a control section 22 for controlling the welding or bonding operation in accordance with the invention.

FIG. 1, as has been noted, shows the welding apparatus in registry with a workpiece 14 and particularly in a position to weld the wire lead 13 onto a component mounted thereon. As has been noted a typical workpiece 14 on which this welding operation is performed will be described in more detail later by reference to FIGS. 3-11. However it includes a substrate 31 on which a semiconductor 39 is mounted in a manner to be described. The metallic wire 13 made of aluminum or gold is bonded to a bonding pad 23 formed on the semiconductor chip 39.

The metallic wire 13 is pressed against the bonding pad 23 of the semiconductor chip 39 by the tip of the tool, for welding. The tool 12, after completing the welding of the metallic wire 13 on the bonding pad 23, is moved to an electrode (not shown) formed on the substrate 31 while pulling out the metallic wire 13. The wire 13 is then welded to the electrode. After the completion of this weld the metallic wire 13 is cut. These steps are repeated and electrodes (bonding pads 23) on the semiconductor chips 39 and electrodes on the substrate are connected by metallic wires 13 in the same manner.

When the tool 12 is pressed against the bonding pad 23 to weld the metallic wire 13, the tool 12 which has been positioned in the X- and Y-directions, is brought down to a given position by the Z-axis motor 18, and a predetermined pressing force is applied to the tool by the load linear motor 17. The pressing force is monitored by a load cell (not shown) and controlled according to a program stored in a memory of a microcomputer in the control section 22.

The control section 22 applies a drive signal A to the ultrasonic oscillator 16 according to a preset program and an ultrasonic vibration is applied to the tool 12 through the vibrator 15 upon an output signal B of the ultrasonic oscillator 16. The load required for the vibration changes depending on the welding state. Regarding the output signal B of the ultrasonic oscillator 16, the control section 22 sends the drive signal A to the ultrasonic oscillator 16 such that the output signal B changes in response to the welding state of the metallic wire 13 at the tip of the tool 12. The same signal as the output signal B is fed back to the control section 22 as an output monitor signal C for monitoring the output. The driving control for the ultrasonic oscillator 16 is determined according to the output monitor signal C.

The output monitor signal C corresponds to the welding state of the metallic wire 13 in the bonding section on the bonding pad 23. Thus if the output monitor signal C is monitored, completion of welding can be detected. In the manner now to be described by reference to FIGS. 2A and 2B. Each of these figures is a diagram of a signal waveform to a semiconductor chip during bonding operation by the wire bonding apparatus of FIG. 1.

In the diagrams (2A), (2B), the curve "a" depicts the amount of depression of the tool 12 detected by the depression sensor 21 in FIG. 1, and the curve "b" depicts the drive signal (ultrasonic output signal) B outputted through a feedback signal from the control section 22. As may be seen, a pressing force is applied at time t0 by the load linear motor 17. As a result of this pressure, the amount of depression "a" is increased.

The ultrasonic oscillator 16 begins operating at time t1, and the ultrasonic output signal A rises in accordance with the conditions normally experienced in this process, as with the prior art. The ultrasonic output signal A increases gradually in response to the bonding state of the wire bonding section.

Figure 2A:
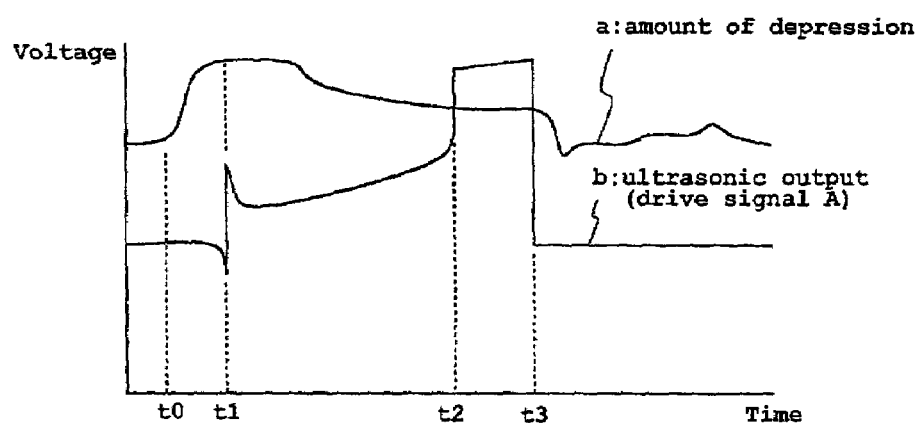
FIGS. 2A and 2B are graphical views showing two alternative ways in which the completion of welding can be determined in practicing the invention.

At time t2, the wire bonding section reaches the state of completion of bonding in which welding of the wire bonding section is completed. It has been found that this is reflected in the ultrasonic signal. As seen in FIG. 2A, the ultrasonic output signal A increases abruptly and then follows a curve of approximately a constant output voltage. Such a change in the ultrasonic output signal waveform may appear great, or hardly appear depending on, for example, the setting condition of the tool 12. In accordance with this embodiment and as shown in the diagram of FIG. 2A, the mounting conditions of the tool, the vibrator, etc, or other bonding requirements are adjusted beforehand such that an abrupt change appears in the waveform of the ultrasonic output signal.

Figure 2B:
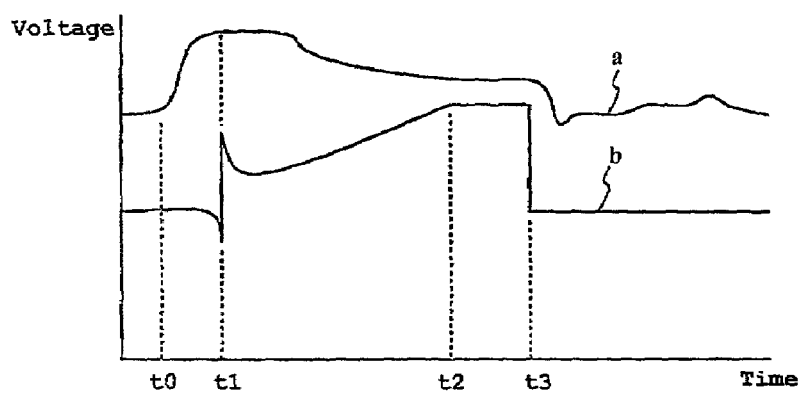

In the case of the diagram of FIG. 2B, no change in the ultrasonic output waveform such as rising appears even when welding of the wire bonding section is completed. However in either cases shown in the diagrams of FIGS. 2A and 2B, the waveform of the ultrasonic output signal b is approximately constant and flat after time t2 when welding of the wire bonding section is completed.

Thus in either case, after the wire is welded and bonding is completed, drive of the ultrasonic oscillator 16 is stopped at time t3 to stop application of the ultrasonic vibration to the tool. Also the drive of the load linear motor 17 is stopped to stop application of the pressing force. Thus, bonding operation on the bonding pad of the semiconductor chip is finished.

Thus in this invention, application of ultrasonic vibration and pressing force is stopped at time t2 when completion of welding is detected and bonding operation on the bonding pad is finished. This may be accomplished by detecting an abrupt change in the waveform of the ultrasonic output signal appears, as shown in the diagram 2A. This is done by setting of the operation is preferably arranged such that bonding is stopped as soon as this change is detected or in a short time after the flat state following the abrupt change is recognized. Alternatively and as shown in the diagram of FIG. 2B, the waveform becomes flat after time t2 even when no rising change appears at t2, so that if this flat waveform is detected, it may be possible that completion of welding in the bonding section is determined so as to stop the bonding operation.

Referring now to FIGS. 3-11 these show a specific type of workpiece that can be welded with the apparatus and methods already described and show an embodiment where a substrate with mounted devices can be used as a motor control unit for driving an electric-powered vehicle.

Figure 3:
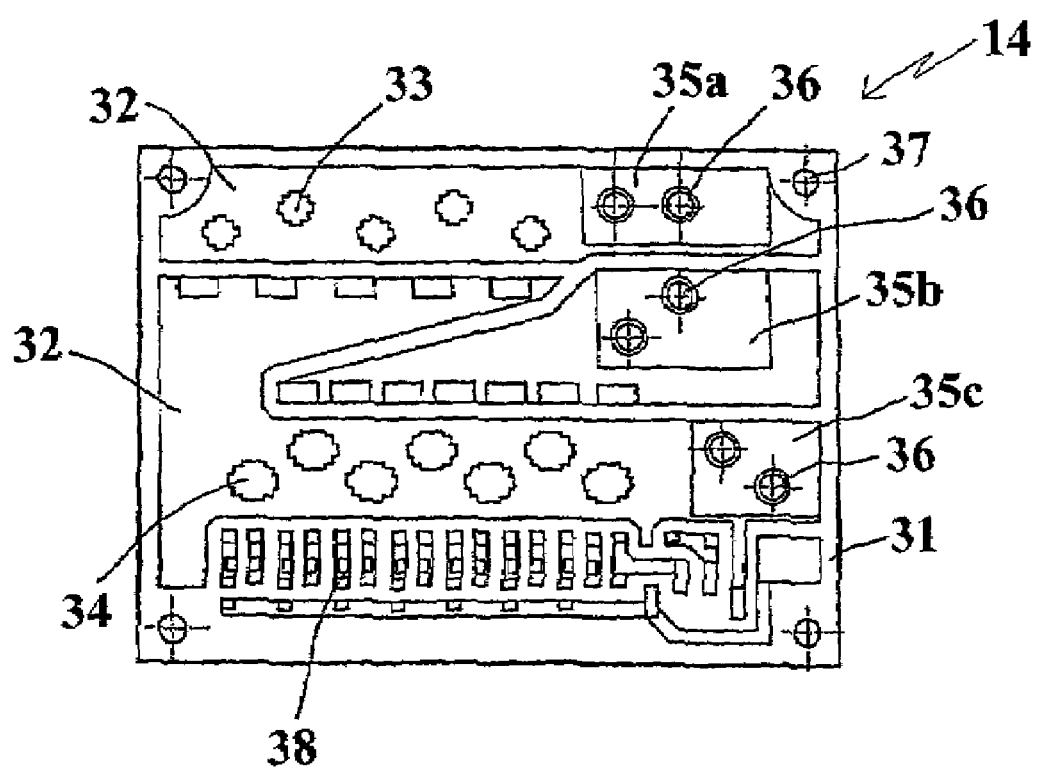
FIG. 3 is a top plan view of an aluminum substrate to which a circuit tested by the present invention is applied.
Figure 4:
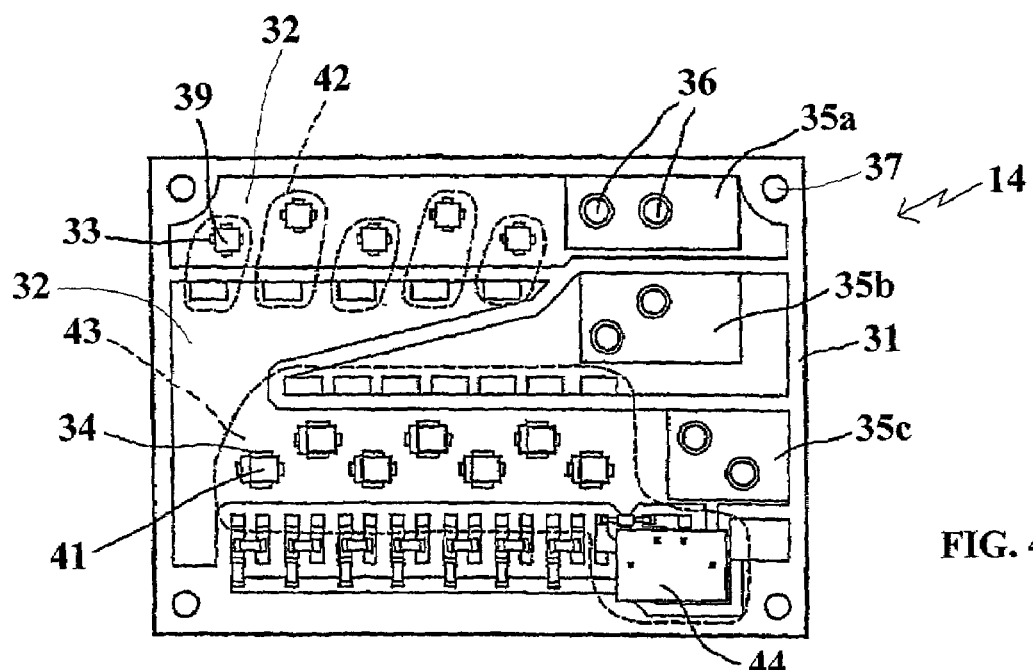
FIG. 4 is a top plan view, in part similar to FIG. 3, but showing the chips and other components mounted on the aluminum substrate.
Figure 5:
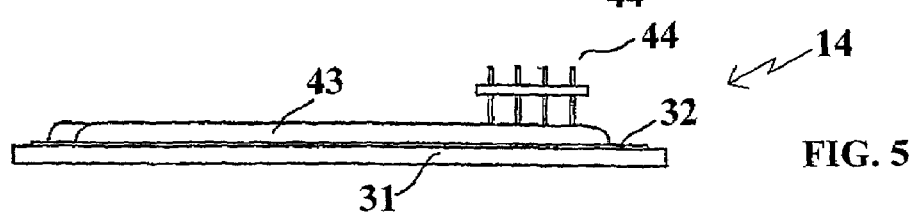
FIG. 5 is a side elevational view of the structure shown in FIG. 4.
Figure 6:
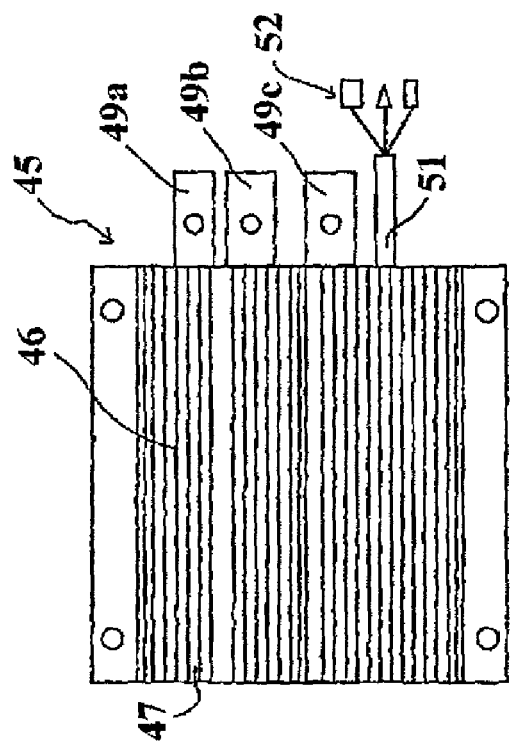
FIG. 6 is top plan view of a motor control unit for an electric-powered vehicle incorporating a circuit tested in accordance with the invention.
Figure 7:
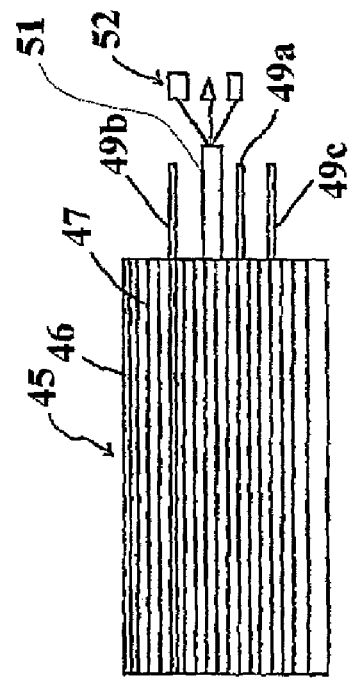
FIG. 7 is a side elevational view of the motor control unit.
Figure 8:
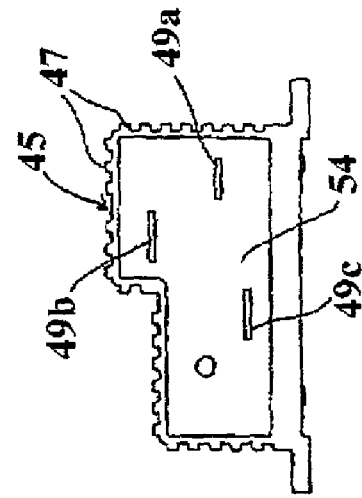
FIG. 8 is an end elevational view of the motor control unit.

As shown first in FIGS. 3-5, the workpiece 14 is comprised of a conductor pattern of copper (not shown) is formed on an aluminum substrate 31 and coated with a resist 32. By patterning the resist 32, diode land patterns 33 and FET land patterns 34 constituting portions of a motor control circuit are formed. Output terminals 35a, 35b, and 35c of the control circuit are formed at three places on the aluminum substrate 31 each having two output terminal holes 36, respectively. At the four corners of the aluminum substrate 31 are disposed mounting holes 37 for fixing a casing body as will be described later by reference to FIGS. 6-11. Further on the substrate is provided a gate resistance 38 forming a further component of the drive circuit.

Diodes 39 are soldered within the respective diode land patterns 33, and FETs 41 are soldered within the respective FET land patterns 34. Each diode 39 is respectively sealed or potted with a resin 42. The connections to all of these semiconductor devices 39 and 41 may be made, as already noted, by the methods and apparatus already described.

Each FET 41 is sealed with resin 43 along with a connector 44. A commercially available liquid sealing material or resin of linear expansion coefficient of (15 to 30)×10$^{-6}$/° C. can be selected to use as the potting material for sealing such diodes 39 and FETs 41. For example, sealing materials of linear expansion coefficient of 15×10$^{-6}$/° C. and 22×10$^{-6}$/° C. approximate to those of copper and aluminum respectively are easily available in the market.

Referring now to FIGS. 6-11, these figures show how a complete motor control unit incorporating the aluminum substrate 31 of FIGS. 3-5 can be constructed. The motor control unit, indicated generally by the reference numeral, 45 includes a drive control circuit configured of the aluminum substrate 31 as previously described by reference to FIGS. 3-5 in a casing body 46.

The casing body 46 is formed by the extrusion of a metallic material of aluminum or aluminum alloy. The casing body 46 is of a cylindrical shape with both ends open. A plurality of aligned parallel ribs 47 are formed to project from its outer circumferential surface. The ribs 47 increase the surface area of the casing body 46, resulting in the increase of heat radiation as well as the rigidity and strength of the casing body 46.

Figure 9:
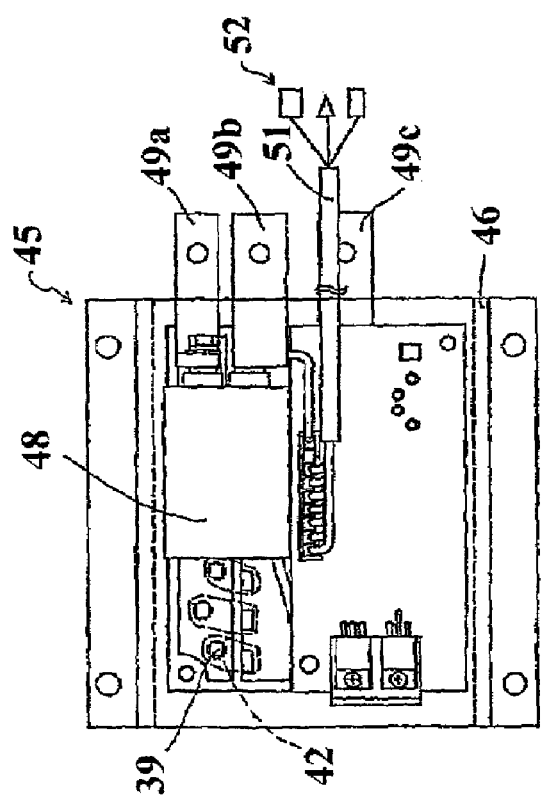
FIG. 9 is a top plan view in part similar to FIG. 6, but with the potting compound removed and showing the contained components in solid lines.
Figure 11:
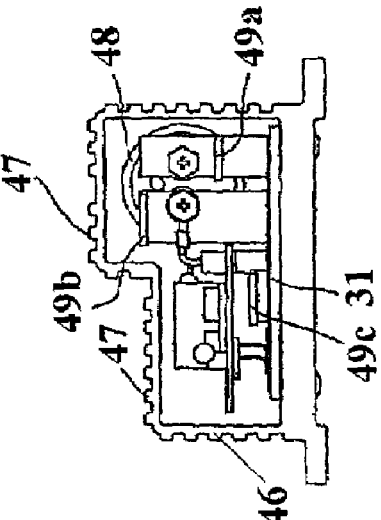
FIG. 11 is an end elevational view in part similar to FIG. 8, but with the potting compound removed and showing the contained components in solid lines.
Figure 10:
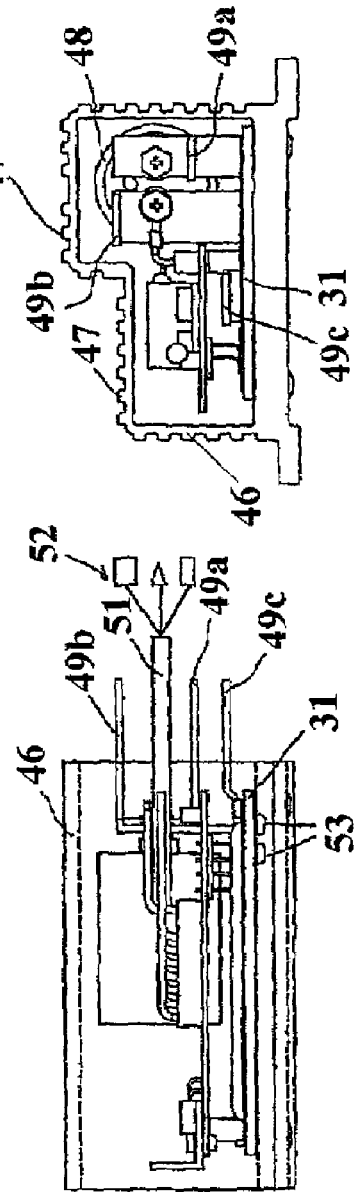
FIG. 10 is a side elevational view in part similar to FIG. 7, but with the potting compound removed and showing the contained components in solid lines.

On the aluminum substrate 31 are mounted further devices constituting a drive control circuit such as an electrolytic capacitor 48 constituting a drive control circuit (FIG. 9). Also terminal attaching plates 49a, 49b, and 49c are connecting to the aforementioned output terminals 35a, 35b, and 36c. Each signal wire of the control circuit is connected through an electric cable 51 and a coupler 52 to switches and other drive or control parts on the vehicle side. Output terminals 53 passing through the aforementioned output terminal holes 37 project from the lower surface of the aluminum substrate 31. Such an aluminum substrate 31 and the electronic parts mounted thereon are accommodated in the casing body 46 and sealed or potted with resin 54.

As described above, the welding state in each bonding section is detected and application of ultrasonic vibration and pressing force is stopped promptly when completion of welding is determined, so that bonding can be finished, corresponding to each wire bonding section at all times, in a shortest time without need of application of unnecessary ultrasonic vibration and pressing force after completion of welding in spite of dispersion of the welding characteristic of the individual bonding pad. Although in the foregoing embodiments, an output voltage feedback circuit from the ultrasonic oscillator is used as a means of detecting completion of welding in the bonding section, and bonding state is determined from the detected signal waveform, this invention is not limited to that, but change in the bonding state may be determined, for example, by detecting the reflected light from the bonding section irradiated with a laser beam.

Of course those skilled in the art will readily perceive that the foregoing description is of preferred embodiments of the methods and apparatus and that various changes and modifications may be made without departing from the spirit and scope of the invention as defined by the appended claims.

The invention claimed is:

1. A wire bonding method for pressure welding a metallic wire to a semiconductor chip having a bonding pad while applying ultrasonic vibration when the semiconductor chip is mounted on a substrate, said method comprising the steps of applying pressure between the metallic wire and the semiconductor chip and simultaneously applying a vibratory force thereto created by an oscillator, detecting the degree of bonding between the metallic wire and the device by a feedback signal from the oscillator, and stopping the application of ultrasonic vibration and pressure in response to the detection of completion of the state of bonding determined from an abrupt change of the waveform of the feedback signal.

2. A wire bonding method as set forth in claim 1 wherein the metallic wire is welded to a bonding pad on the semiconductor chip.

3. A wire bonding method for pressure welding a metallic wire to a semiconductor chip having a bonding pad while applying ultrasonic vibration when the semiconductor chip is mounted on a substrate, said method comprising the steps of applying pressure between the metallic wire and the semiconductor chip and simultaneously applying a vibratory force thereto created by an oscillator, detecting the degree of bonding between the metallic wire and the device by a feedback signal from the oscillator, and stopping the application of ultrasonic vibration and pressure in response to the detection of completion of the state of bonding determined from a lack of significant change in the waveform of the feedback signal.

4. A wire bonding method as set forth in claim 3 wherein the device comprises a semiconductor chip and the metallic wire is welded to bonding pad on the semiconductor chip.

5. A wire bonding method as set forth in claim 4 wherein the semiconductor chip is mounted on a substrate when the metallic wire is welded.

6. A wire bonding apparatus having a tool for holding a metallic wire to press it against a device, a vibrator for applying ultrasonic vibration to said tool, an oscillator for powering said vibrator, a control section controlling output of said oscillator, a pressing device for applying pressing force to said tool, a bonding detector that detects the degree of bonding of the metallic wire to the device to advise said control section when to terminate welding wherein the bonding detector detects the completion of welding by sensing an abrupt change of the waveform of a feedback signal from the oscillator.

7. A wire bonding apparatus having a tool for holding a metallic wire to press it against a device, a vibrator for applying ultrasonic vibration to said tool, an oscillator for powering said vibrator a control section for controlling output of said oscillator, a pressing device for applying pressing force to said tool, a bonding detector that detects the decree of bonding of the metallic wire to the device to advise said control section when to terminate welding wherein the bonding detector detects the completion of welding by sensing a lack of significant chance of the waveform of a feedback signal from the oscillator.

* * * * *